United States Patent
Fu et al.

(10) Patent No.: US 7,728,952 B2
(45) Date of Patent: Jun. 1, 2010

(54) METHOD AND SYSTEM FOR CLOSING PLATE TAKE-OVER IN IMMERSION LITHOGRAPHY

(75) Inventors: Tzung-Chi Fu, Miaoli (TW); Hsin Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 645 days.

(21) Appl. No.: 11/627,247

(22) Filed: Jan. 25, 2007

(65) Prior Publication Data

US 2008/0182208 A1 Jul. 31, 2008

(51) Int. Cl.
G03B 27/52 (2006.01)
G03B 27/42 (2006.01)
G03B 27/58 (2006.01)
G03B 27/32 (2006.01)

(52) U.S. Cl. .................... 355/30; 355/53; 355/72; 355/77

(58) Field of Classification Search ............. 355/30, 355/53, 72, 77
See application file for complete search history.

(56) References Cited

U.S. PATENT DOCUMENTS

| | | | |
|---|---|---|---|
| 7,119,876 B2* | 10/2006 | Van Der Toorn et al. | 355/53 |
| 7,372,538 B2* | 5/2008 | Binnard | 355/30 |
| 2005/0286032 A1* | 12/2005 | Lof et al. | 355/53 |
| 2006/0103820 A1* | 5/2006 | Donders et al. | 355/53 |

FOREIGN PATENT DOCUMENTS

JP 2006140498(A) 6/2006

OTHER PUBLICATIONS

Japanese Office Action on Application No. JP2006-140498 dated Jul. 24, 2009, 6 pages.

* cited by examiner

*Primary Examiner*—Alan A Mathews
(74) *Attorney, Agent, or Firm*—Haynes and Boone, LLP

(57) ABSTRACT

Aspects of the present disclosure provide a method and a system for closing plate take-over in immersion lithography. A plate holder is provided for a closing plate in a wafer holder of an immersion lithography system. An optical detector is provided below the plate holder for determining whether a light signal passing through the closing plate is aligned with the plate holder using the optical detector. If the light signal is aligned, a fluid containment mechanism is lowered, and the closing plate is placed into the plate holder. Alternatively, the fluid containment mechanism is lowered to surface of the closing plate, the closing plate is affixed to the mechanism, and the mechanism is raised with the closing plate. If the light signal is not aligned, an error is triggered and the scanner is stopped.

9 Claims, 17 Drawing Sheets

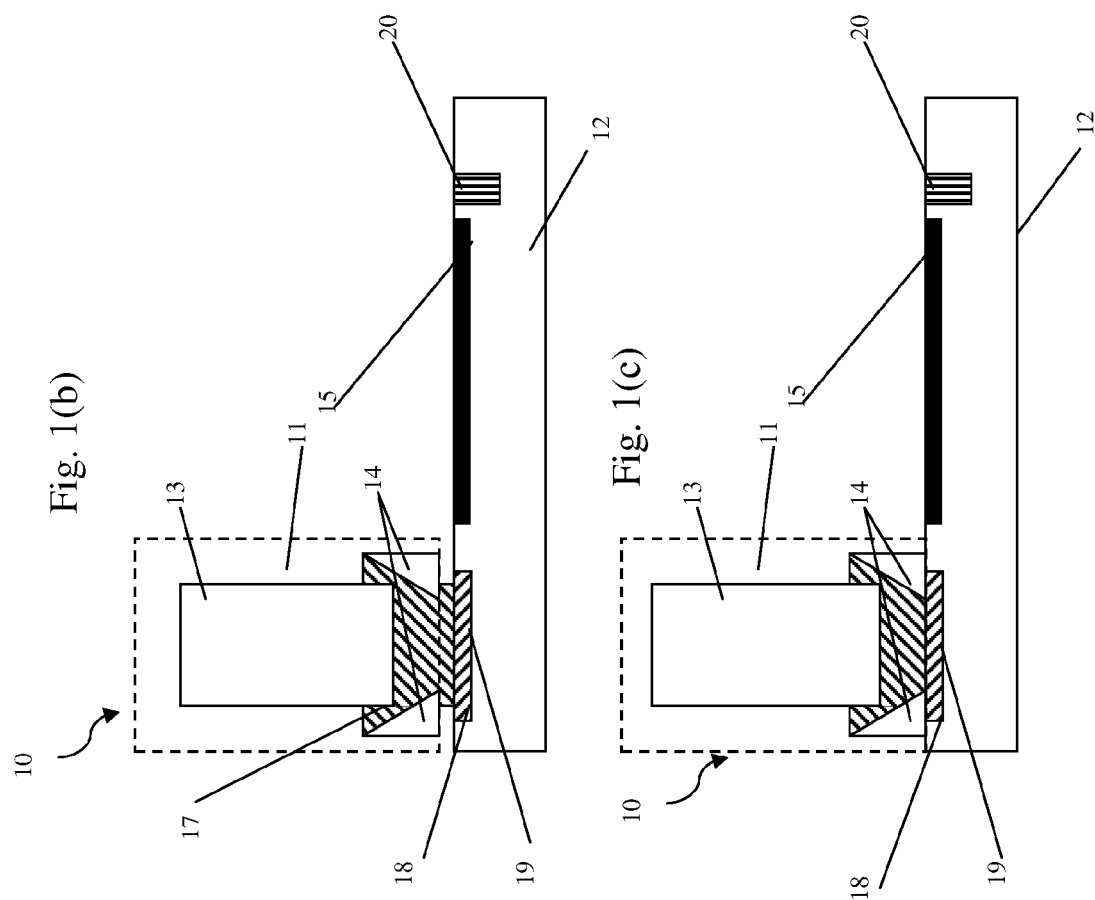

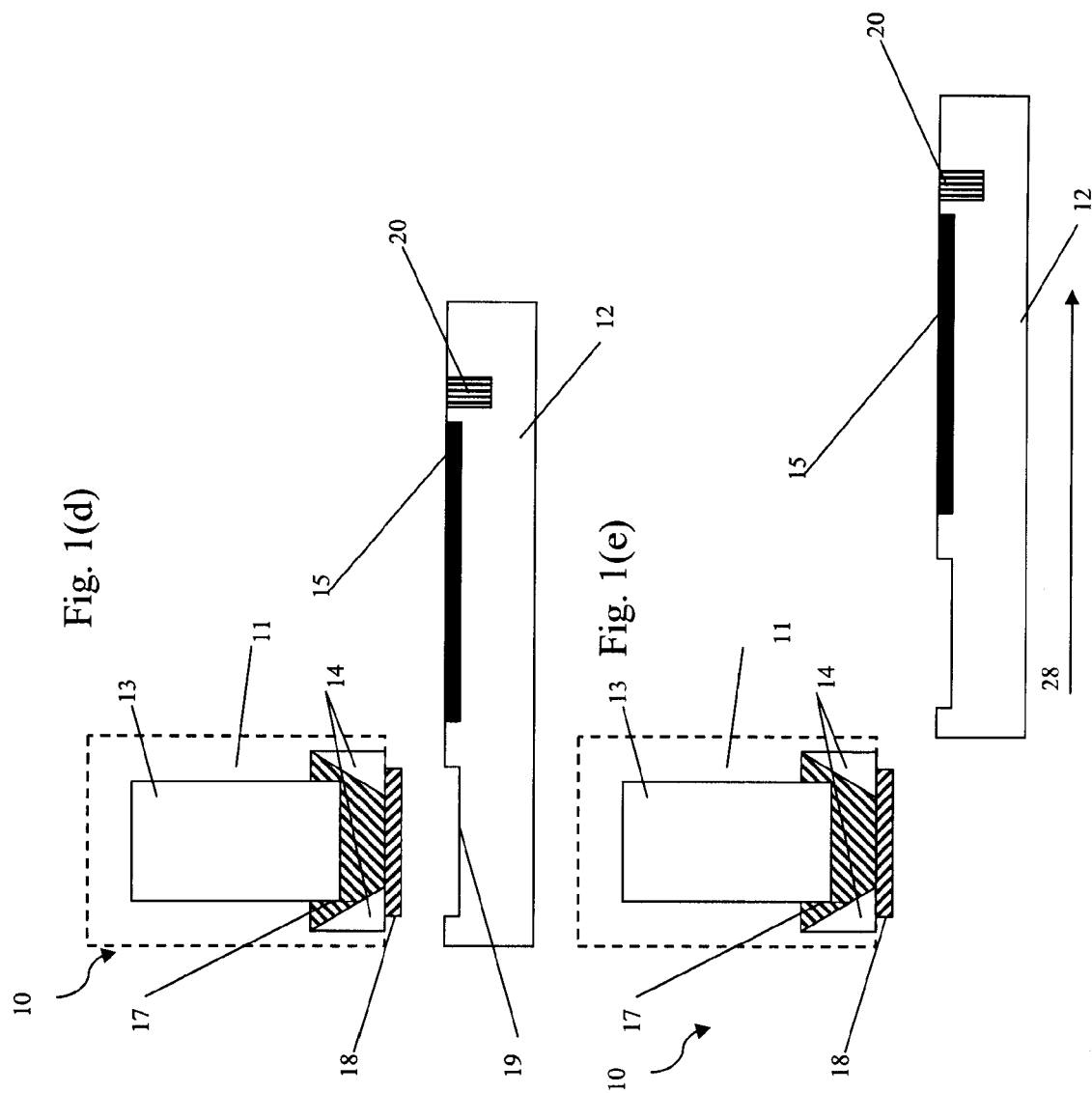

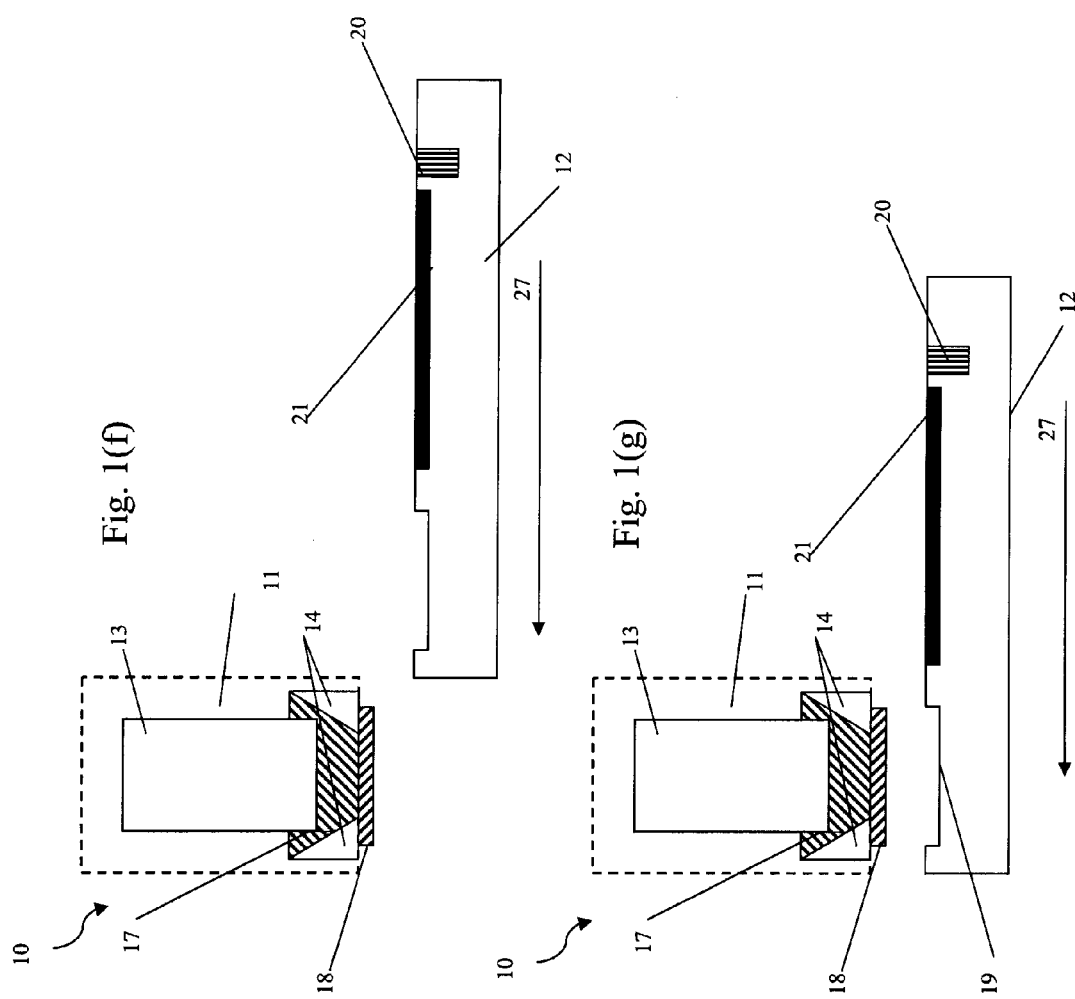

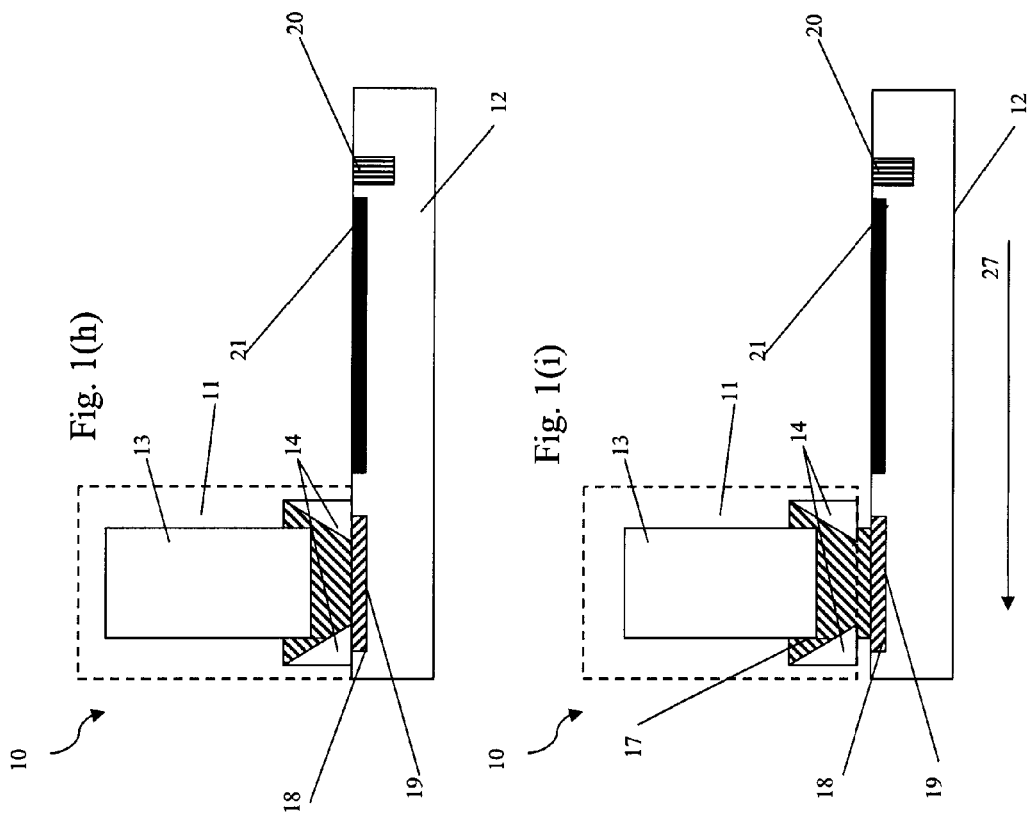

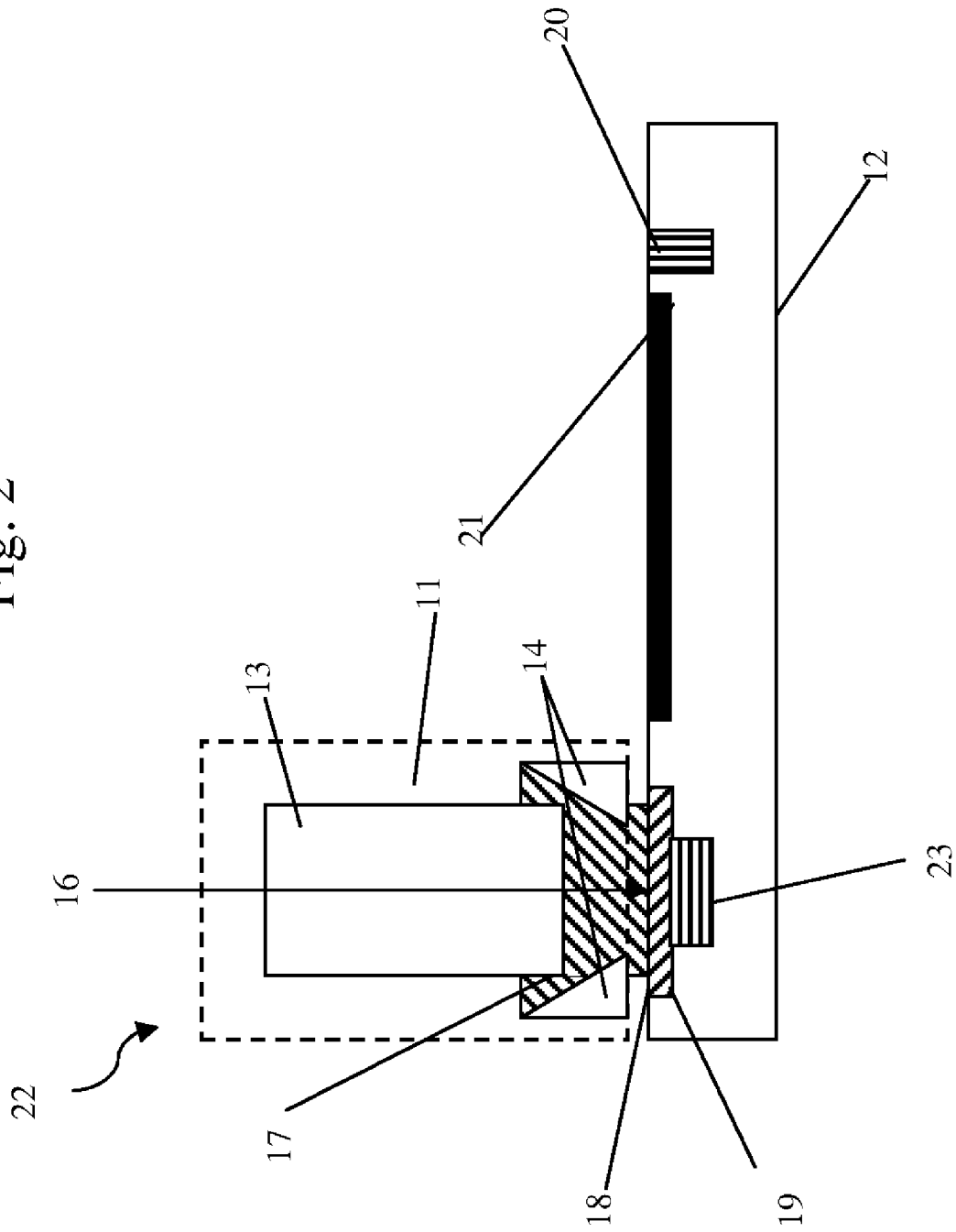

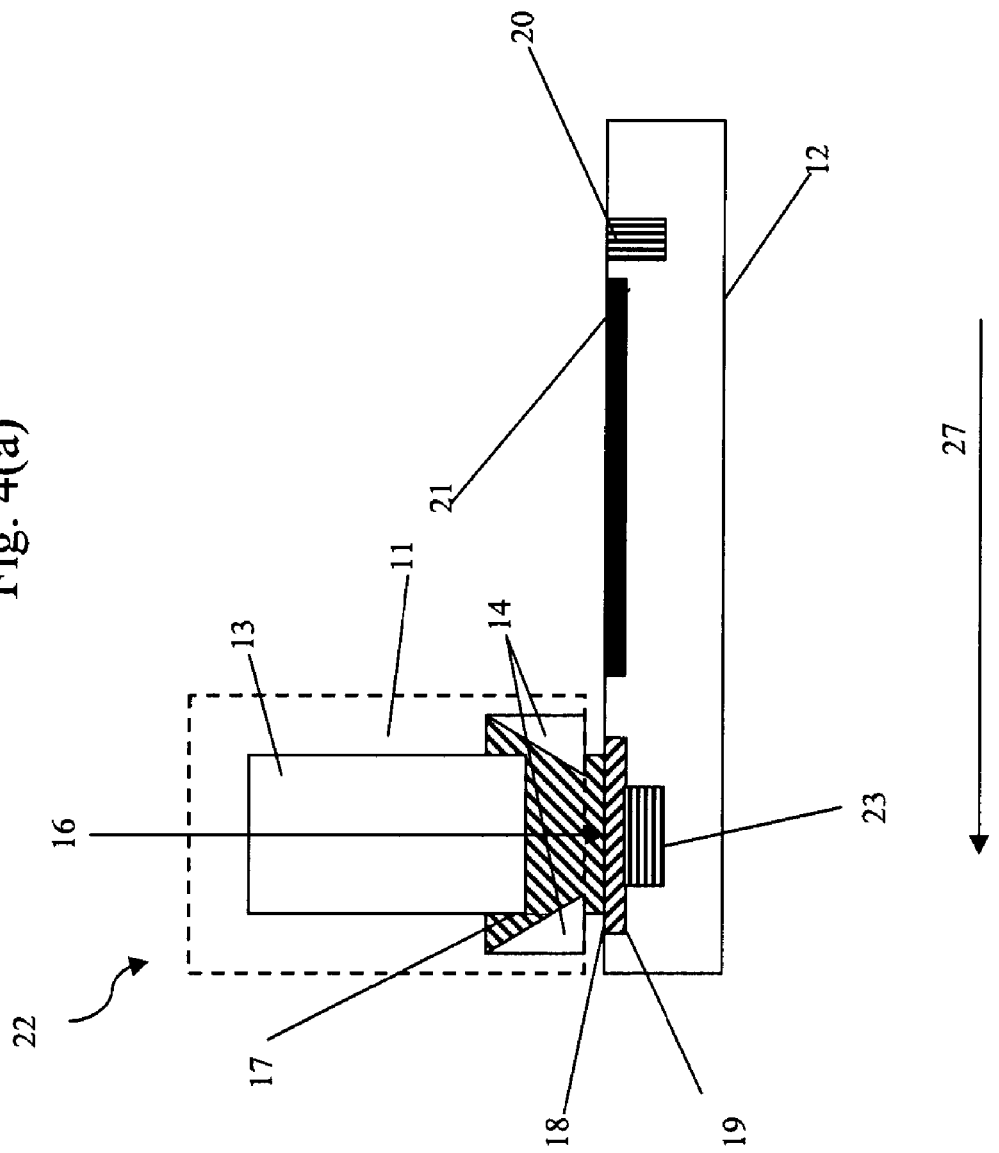

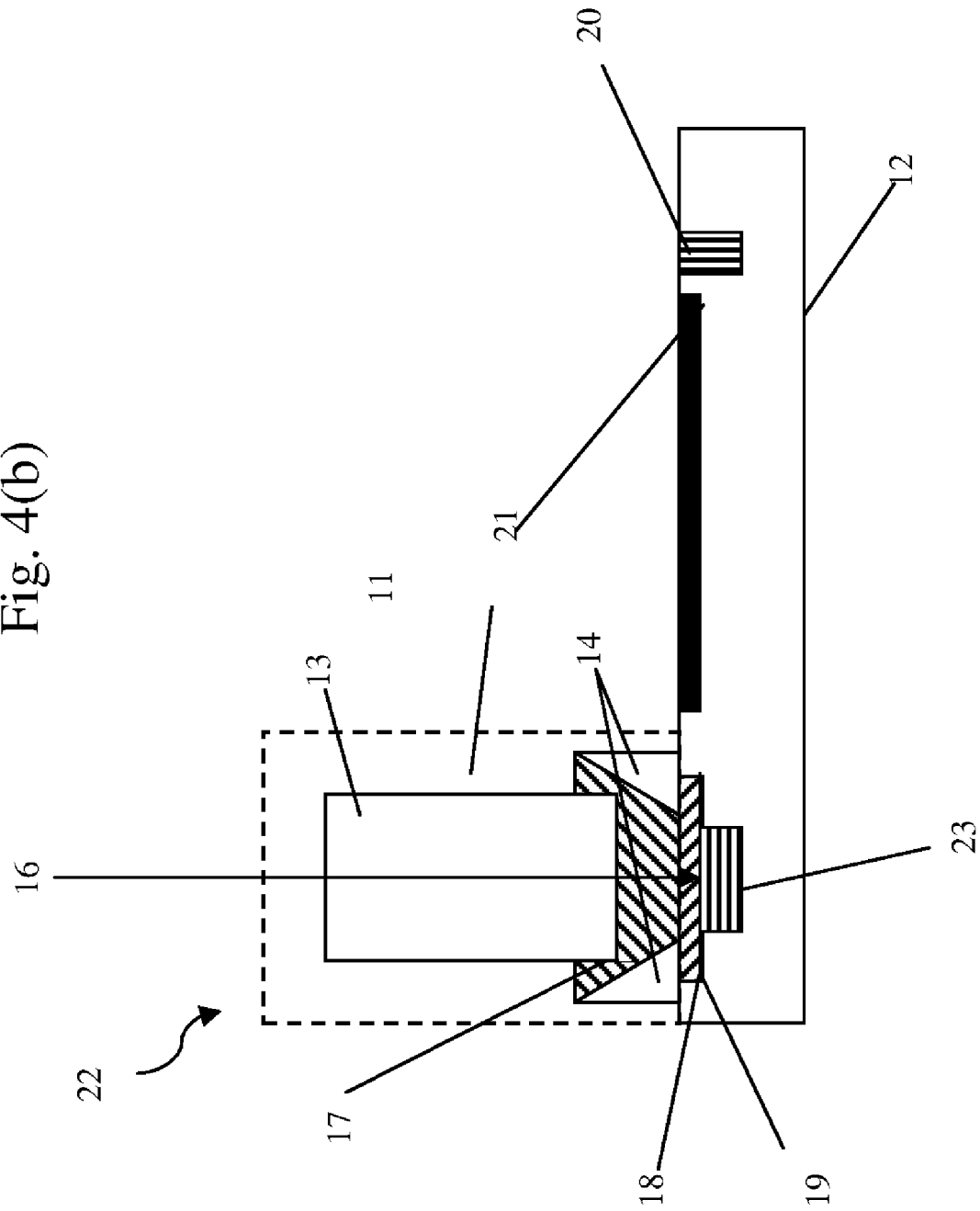

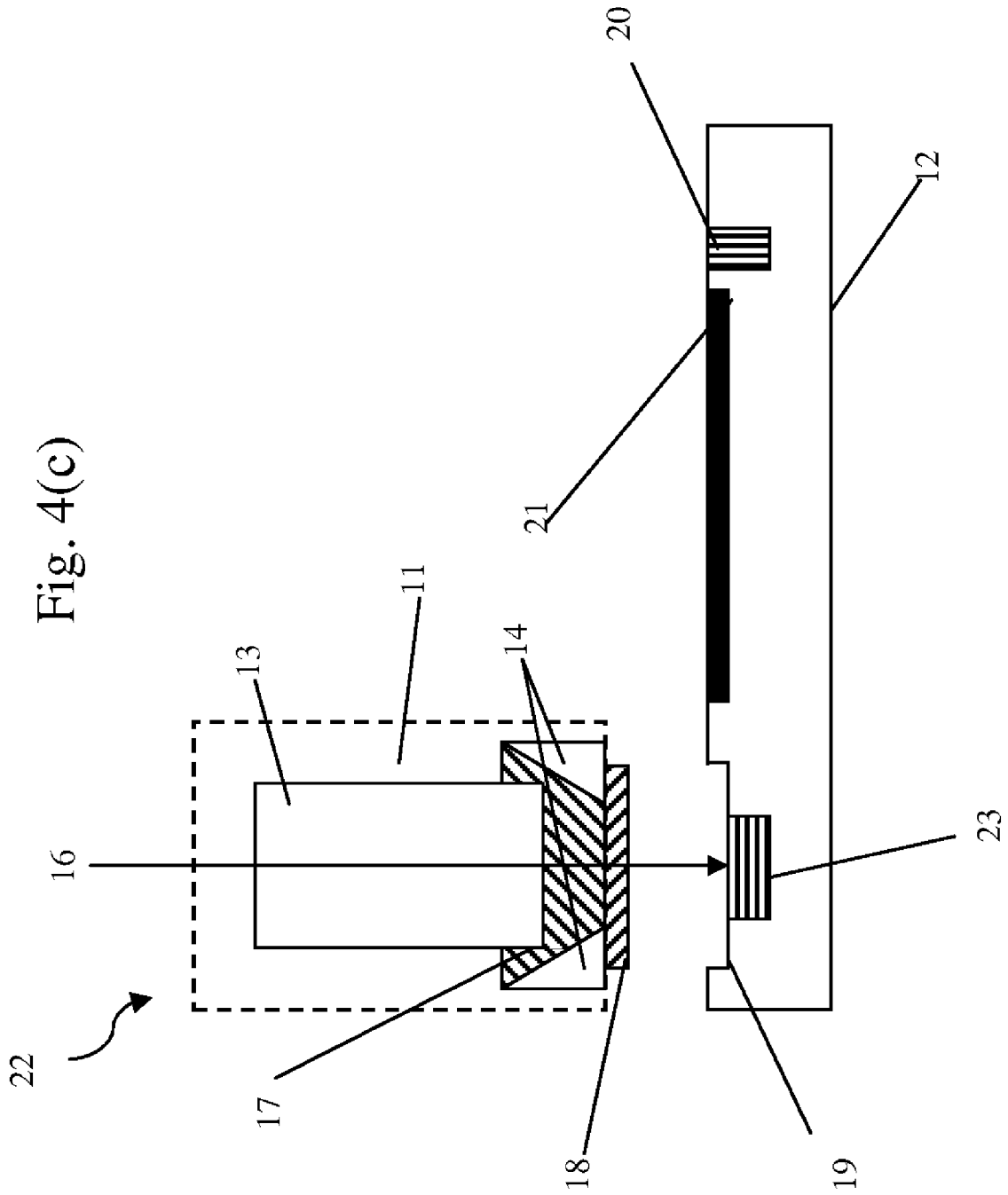

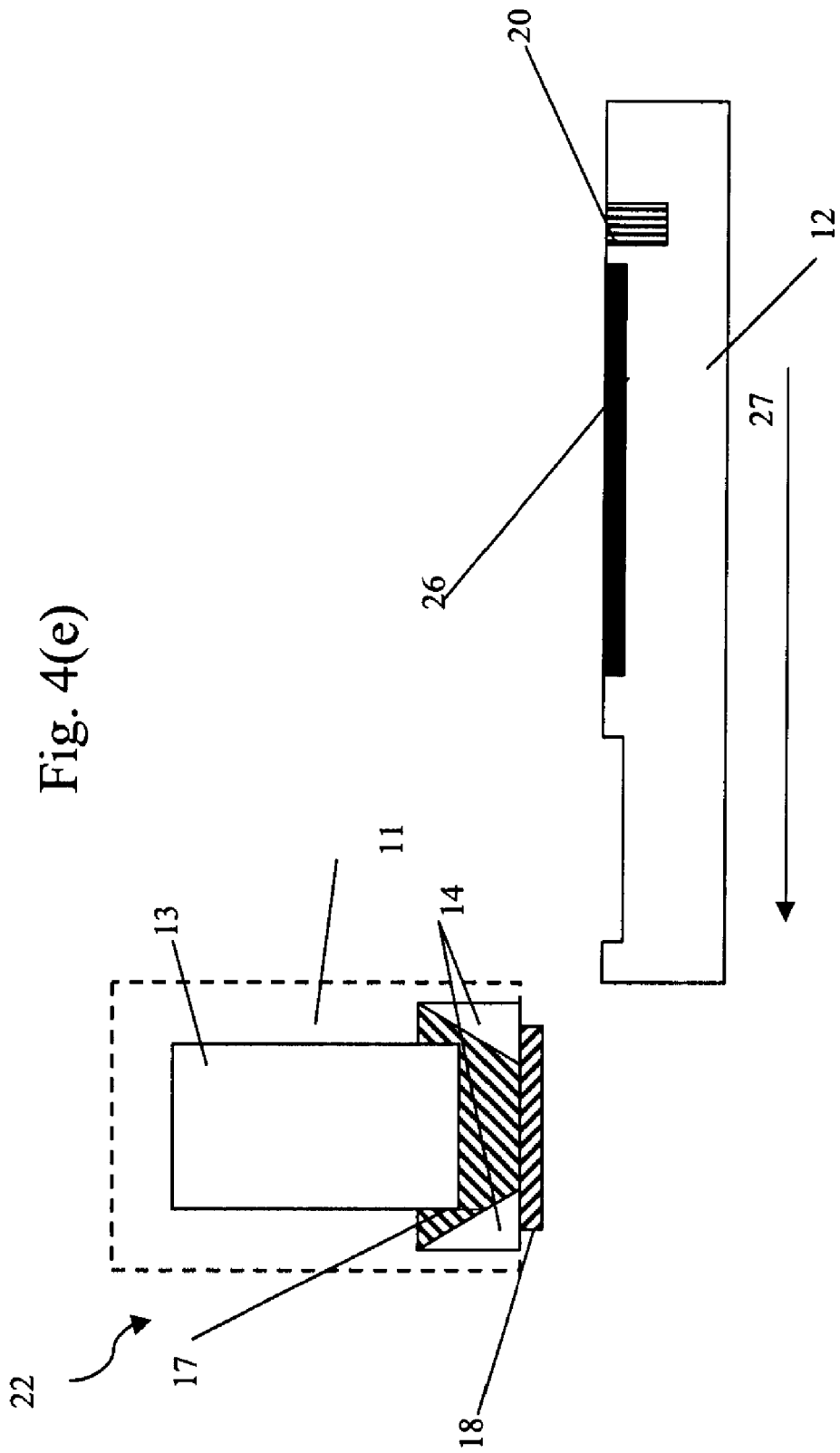

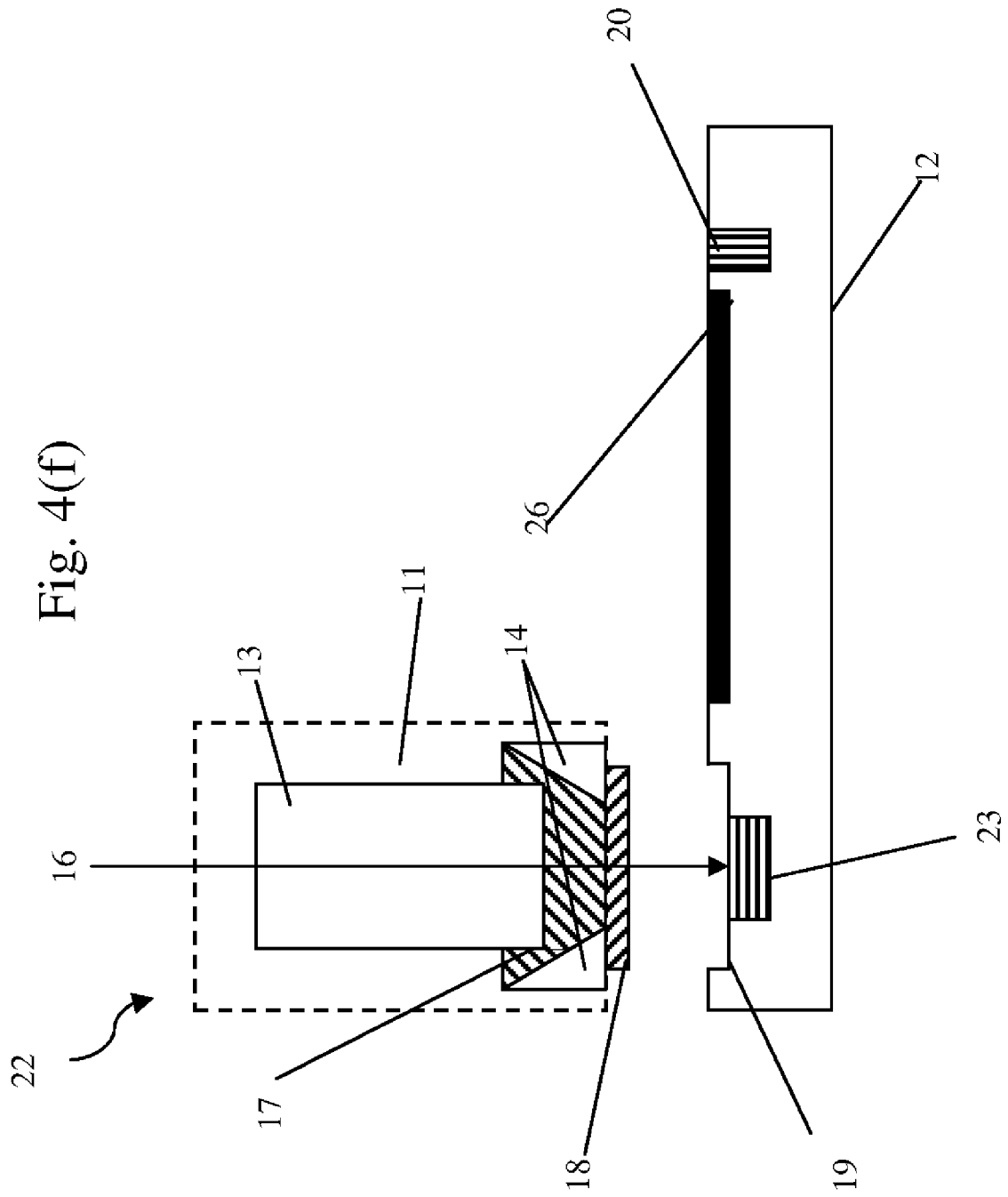

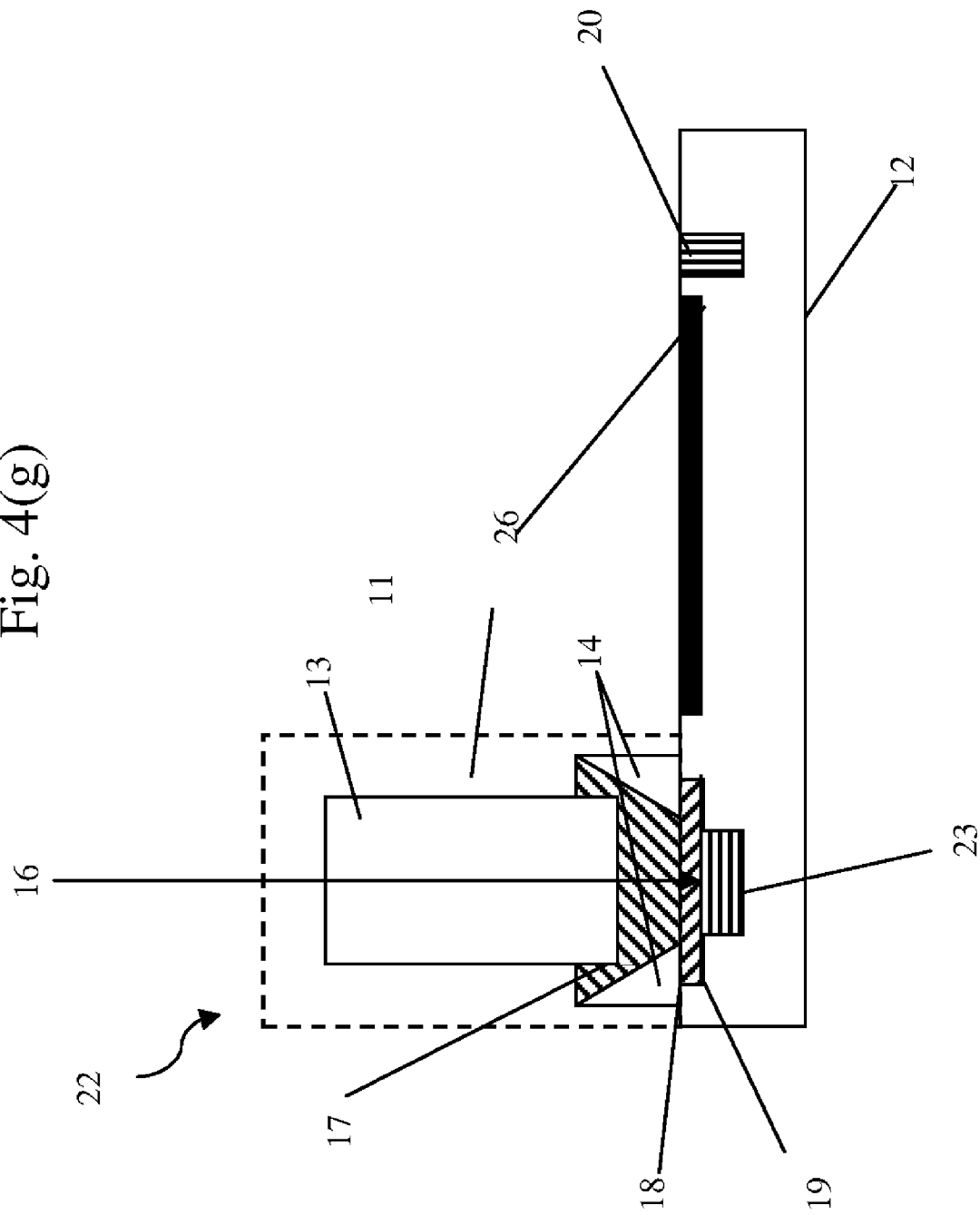

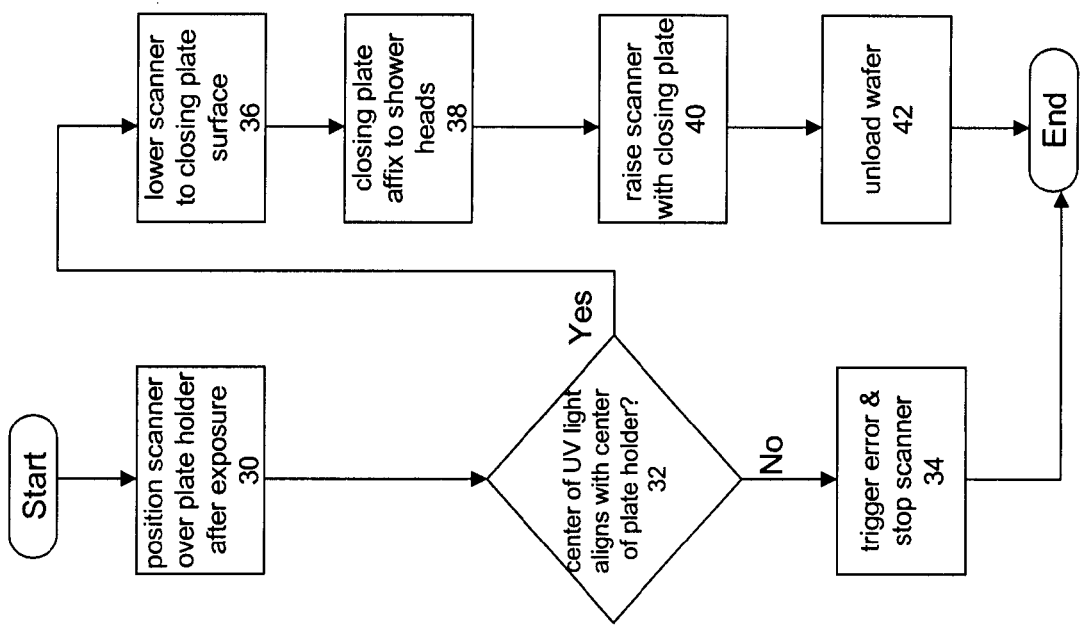

METHOD AND SYSTEM FOR CLOSING PLATE TAKE-OVER IN IMMERSION LITHOGRAPHY

BACKGROUND

Immersion lithography is a resolution enhancement technique for exposing images on a substrate such as a surface of a semiconductor wafer. Immersion lithography interposes a high refractive index fluid, such as water, between a projection lens of a lithography system and the substrate. The substrate is typically positioned on a stage or holder, and the fluid is maintained between the projection lens and the stage by a fluid containment mechanism, e.g., a set of "shower heads." An image can then be projected, such as with deep ultra-violet (DUV) radiation, through the projection lens, through the immersion fluid, and then be exposed onto the substrate surface.

In order to isolate the fluid from the substrate surface during loading and unloading, a fluid closing plate may be used. During exposure, the fluid closing plate is placed in a plate holder of the stage. Prior to wafer unloading, the fluid closing plate is lifted from the plate holder and affixed to the fluid containment mechanism. In this way, the fluid is isolated from the substrate surface while the substrate is unloading. After a new substrate is loaded onto the stage, the fluid closing plate is resituated in the plate holder. This allows the immersion fluid to re-interpose between the projection lens and the substrate surface. The process in which the fluid closing plate is dislocated from the plate holder and resituated is referred to as "closing plate take-over."

Currently, the position of the fluid closing plate is calibrated after a defined number of cycles using a transmission image sensor (TIS). The transmission image sensor is mounted inside the substrate holder at a distance from the plate holder. The transmission image sensor calibrates the plate position by detecting the DUV radiation projected from the projection lens and adjusting the plate position based on the distance between the detected radiation and the plate holder.

However, this type of calibration is not efficient because extra maintenance time is needed to adjust the plate position if it is out of specification. In addition, the calibration does not monitor plate position after every closing plate take over. This may result in a collision of the fluid closing plate with the wafer holder or other materials, which may lead to damage of parts, unwanted particles, and machine downtime.

A need exists for a method and system that monitor the position of the fluid closing plate after every closing plate take-over. In this way, collision with the wafer holder or other materials may be avoided and efficiency of immersion lithography may be improved.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1(a)-1(i) are diagrams illustrating a fluid closing plate take-over process according to one embodiment of the present disclosure.

FIG. 2 is a diagram of a system for closing plate take-over in accordance with another embodiment of the present disclosure.

FIGS. 4(a)-4(h) are diagrams of a fluid closing plate take over process in accordance with one embodiment of the present disclosure.

FIG. 5 is a flow diagram of an exemplary process for fluid closing plate take-over during wafer unloading.

DETAILED DESCRIPTION

The present disclosure relates generally to immersion lithography, such as can be used for fabrication of semiconductor devices. It is understood, however, that specific embodiments are provided as examples to teach the broader inventive concept, and one of ordinary skill in the art can easily apply the teachings of the present disclosure to other methods and systems. Also, it is understood that the methods and systems discussed in the present disclosure include some conventional structures and/or steps. Since these structures and steps are well known in the art, they will only be discussed in a general level of detail. Furthermore, reference numbers are repeated throughout the drawings for the sake of convenience and clarity, and such repetition does not indicate any required combination of features or steps throughout the drawings.

Figure 1A:
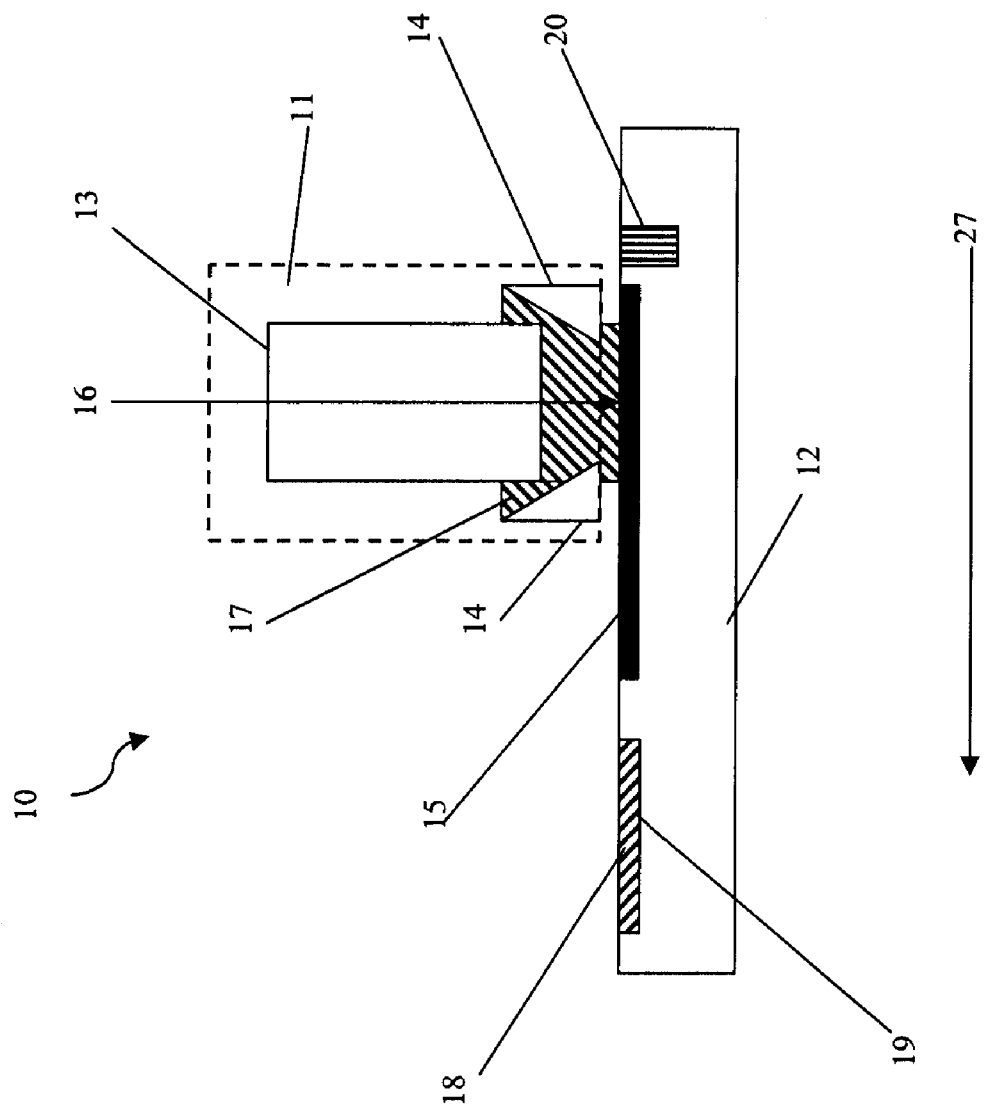

FIGS. 1(a)-1(i) illustrate one embodiment of a fluid closing plate take-over process using an immersion lithography system 10. In FIG. 1(a), the immersion lithography system 10 includes a scanner mechanism 11 and a wafer holder 12. The scanner mechanism 11 includes a projection lens 13 and a fluid containment mechanism (e.g., a set of shower heads) 14. Wafer holder 12 holds a wafer 15 for exposure by the projection lens 13. The scanner mechanism 11 is mostly fixed in position while the wafer holder 12 is easily movable to allow scanning of the wafer 15. During exposure, a deep ultraviolet light 16 is projected onto the wafer 15 through the projection lens 13 to pattern the wafer 15. The ultraviolet light 16 may be a 193 nm UV laser.

A high refractive index immersion fluid 17 is interposed between the projection lens 13 and the surface of wafer 15 during the exposure process. The set of shower heads 14, also referred to as a fluid containment mechanism, constrain the immersion fluid 17 underneath the projection lens 13. The high refractive index immersion fluid 17 provides a resolution enhancement, because the projection lens 13 may be designed with numerical aperture greater than one. A fluid closing plate 18 is provided and is placed in plate holder 19 of the wafer holder 12 during exposure. Prior to wafer unloading, the fluid closing plate 18 is lifted from the plate holder 19 and affixed to the fluid containment mechanism. The fluid closing plate 18 isolates the fluid from the substrate surface 15 while the substrate is unloading. After a new substrate is loaded onto the stage, the fluid closing plate 18 is resituated in the plate holder 19, which allows the immersion fluid 17 to re-interpose between the projection lens 13 and the substrate surface 15. The process in which the fluid closing plate 18 is dislocated from the plate holder 19 and resituated is referred to as "closing plate take-over."

In one embodiment, the fluid closing plate may be made of quartz or other non-porous material. An example of the thickness of the fluid closing plate 18 may be about 1 mm. A transmission image sensor (TIS) 20 is also provided and placed within the wafer holder 12 distant from the plate holder 19. During exposure, the scanner mechanism 11 scans across the surface of the wafer 15 in a wafer loading direction 27.

In FIG. 1(b), after the scanner mechanism 11 finishes scanning the surface of wafer 15, the wafer holder 12 moves to a position where the scanner mechanism 11 is directly over the fluid closing plate 18, which is placed in the plate holder 19. In FIG. 1(c), in order to isolate the immersion fluid 17 from the wafer surface while the wafer 15 is unloading, the set of shower heads 14 is lowered to make contact with the surface of the fluid closing plate 18. The fluid closing plate 18 is then affixed to the set of shower heads 14. The fluid closing plate 18 may be affixed by a vacuum force provided by the scanner mechanism 11. In FIG. 1(d), the scanner mechanism 11 is raised along with the fluid closing plate 18, which prevents immersion fluid 17 from dispensing onto the wafer surface. Once the fluid closing plate 18 is raised, the plate holder 19 is now empty. In FIG. 1(e), the wafer holder 12 moves in a wafer unloading direction 28 and the wafer 15 is unloaded.

In FIG. 1(f), a new wafer 21 is loaded into wafer holder 12 and the wafer holder 12 moves in a wafer loading direction 27. In FIG. 1(g), the wafer holder 12 moves to a position where the scanner mechanism 11 with the fluid closing plate 18 affixed is directly over the plate holder 19. In FIG. 1(h), the fluid closing plate 18 is lowered into the plate holder 19. The position of the fluid closing plate 18 is determined by the transmission image sensor 20, which calibrates the plate position after a defined number of wafer cycles, for example, every 400 wafers. In FIG. 1(i), once the fluid closing plate 18 is in the plate holder 19, the fluid closing plate take-over process terminates and immersion fluid 17 is re-interposed between the projection lens 13 and the surface of the wafer 21. The scanner mechanism 11 continues to scan the wafer surface as the wafer holder 12 moves in the wafer loading direction 27.

Referring now to FIG. 2, in another embodiment, an immersion lithography system 22 includes many of the same components of the system 10 discussed above, with modifications and additional components as discussed below. The immersion lithography system 22 includes the scanner mechanism 11 and the wafer holder 12. The scanner mechanism 11 includes the projection lens 13 and the set of shower heads 14. The wafer holder 12 holds the wafer 15 for exposure by the projection lens 13. The scanner mechanism 11 is mostly fixed in position while the wafer holder 12 is easily movable to allow scanning of the wafer 15. During exposure, a deep ultraviolet light 16 is projected onto the wafer 15 through the projection lens 13. A high refractive index immersion fluid 17 is interposed between the projection lens 13 and the surface of wafer 15 during the exposure process. The set of shower heads 14, also referred to as a fluid containment mechanism, constrain the immersion fluid 17 underneath the projection lens 13.

The fluid closing plate 18 is provided and placed in the plate holder 19 of the wafer holder 12 during exposure. Prior to wafer unloading, the fluid closing plate 18 is lifted from the plate holder 19 and affixed to the fluid containment mechanism. The fluid closing plate 18 isolates the fluid from the substrate surface 15 while the substrate is unloading. After a new substrate is loaded onto the stage, the fluid closing plate 18 is resituated in the plate holder 19, which allows the immersion fluid 17 to re-interpose between the projection lens 13 and the substrate surface 15. The process in which the fluid closing plate 18 is dislocated from the plate holder 19 and resituated is referred to as "closing plate take-over."

In one embodiment, the fluid closing plate 18 may be made of quartz or other non-porous material. An example of the thickness of the fluid closing plate 18 may be about 1 mm. The transmission image sensor 20 is also provided and placed within the wafer holder 12 distant from the plate holder 19.

In addition, a position alignment system including an optical detector 23 is provided within wafer holder 12. Those of ordinary skill in the art will know of many different types of optical detectors that can be used. The optical detector 23 is located below the fluid closing plate 18 situated in the plate holder 19. The optical detector 23 is preferably located below the center of the plate holder 19 with equal distance from both ends of plate holder 19. In an illustrative embodiment, the optical detector 23 detects the plate position by analyzing the deep ultraviolet light 16 passing passes through a pattern of the fluid closing plate 18. If center of the deep ultraviolet light 16 is aligned with the center of the plate holder 19, the position of the fluid closing plate 18 is aligned with the plate holder 19 and the fluid closing plate 18 may be lowered to the plate holder 19. Otherwise, an error is triggered to indicate that the position of the fluid closing plate 18 is shifted out of specification.

Figure 3:
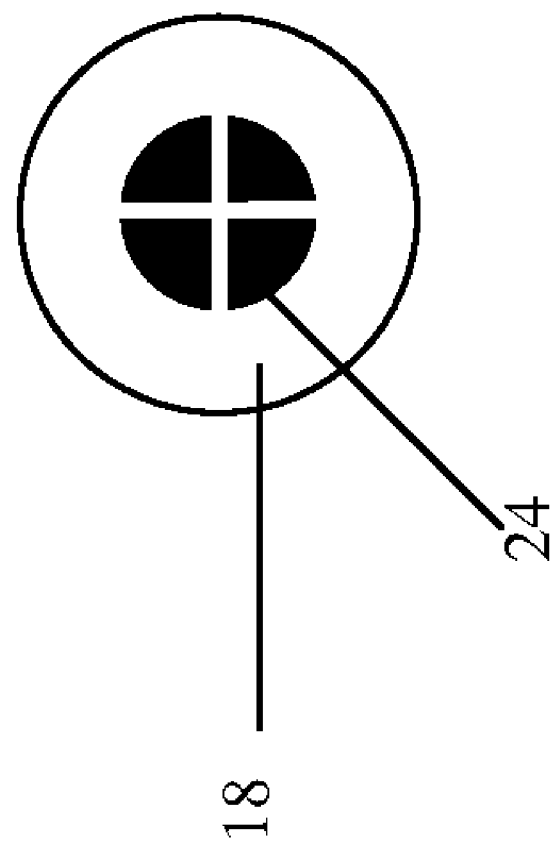
FIG. 3 is a diagram of a top view of a fluid closing plate used in the embodiment of FIG. 2.

FIG. 3 is a diagram of a top view of the fluid closing plate according to the embodiment discussed above in FIG. 2. In this embodiment, the fluid closing plate 18 includes a circular pattern 24. When the wafer holder 12 moves to a position where the scanner mechanism 11 is directly over the fluid closing plate 18, the optical detector 23 analyzes and determines if the center of deep ultraviolet light 16 passing through pattern 24 is aligned with the center of the plate holder 19. The center of deep ultraviolet light 16 is aligned with the center of the plate holder 19 if the center of deep ultraviolet light 16 lies exactly in the center of the plate holder 19. If the optical detector 23 detects that the center of deep ultraviolet light 16 does not align with the center of the plate holder 19, the position of the fluid closing plate 18 is shifted out of specification. At this time, an error indicator may be triggered and the operation of the scanner mechanism 11 may be halted. Appropriate correction can then be initiated to rectify the problem.

FIGS. 4(a)-4(c) are diagrams of a fluid closing plate take over process in accordance with one embodiment of the present disclosure using the immersion lithography system 22 of FIGS. 2 and 3. In FIG. 4(a), after the scanner mechanism 11 finishes scanning the surface of wafer 21, the wafer holder 12 moves to a position where the scanner mechanism 11 is directly over the fluid closing plate 18 in the plate holder 19. At this time, the optical detector 23 analyzes and determines whether the center of deep ultraviolet light 16 passing through the circular pattern 24 is aligned with the center of the plate holder 19. The center of deep ultraviolet light 16 is aligned with the center of the plate holder 19 if the center of deep ultraviolet light 16 lies exactly in the center of the plate holder 19.

If the center of the deep ultraviolet light 16 does not align with the center of the plate holder 19, an error is triggered to indicate that the position of the fluid closing plate 18 is out of specification and the scanner mechanism 11 is stopped. In FIG. 4(b), if the center of the deep ultraviolet light 16 is aligned with the center of the plate holder 19, the set of shower heads 14 is lowered to the surface of the fluid closing plate 18 and the fluid closing plate 18 is affixed to the set of shower heads 14. The fluid closing plate may be affixed by a vacuum force provided by the scanner mechanism 11.

Figure 4D:
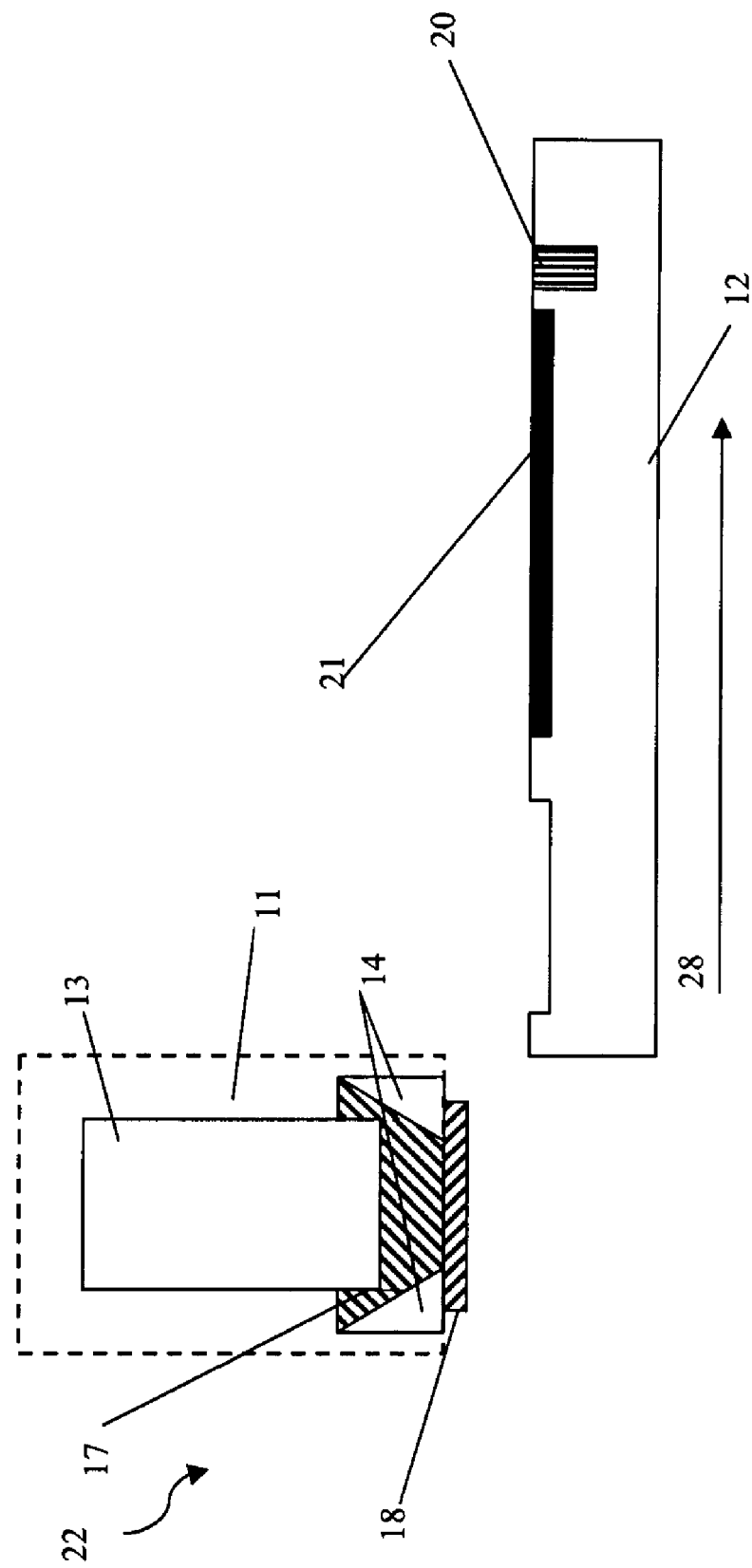

In FIG. 4(c), the scanner mechanism 11 is raised along with the fluid closing plate 18, which isolates immersion fluid 17 from the wafer surface. Once the fluid closing plate 18 is raised, the plate holder 19 is now empty. In FIG. 4(d), the wafer holder 12 moves in a wafer unloading direction 28 and the wafer 21 is unloaded. In FIG. 4(e), a new wafer 26 is loaded onto wafer holder 12 and the wafer holder 12 moves in a wafer loading direction 22. In FIG. 4(f), the wafer holder 12 moves to a position, where scanner mechanism 11 with the fluid closing plate 18 affixed is directly over the plate holder 19. Before the fluid closing plate 18 is lowered into the plate holder 19, optical detector 23 analyzes and determines whether the center of the deep ultraviolet light 16 passing through pattern 24 is aligned with the center of the plate holder 19. The center of deep ultraviolet light 16 is aligned with the center of the plate holder 19 if the center of deep ultraviolet light 16 lies exactly in the center of the plate holder 19. If the center of deep ultraviolet light 16 does not align with the center of the plate holder 19, an error is triggered and the scanner mechanism 11 is stopped.

Figure 4H:
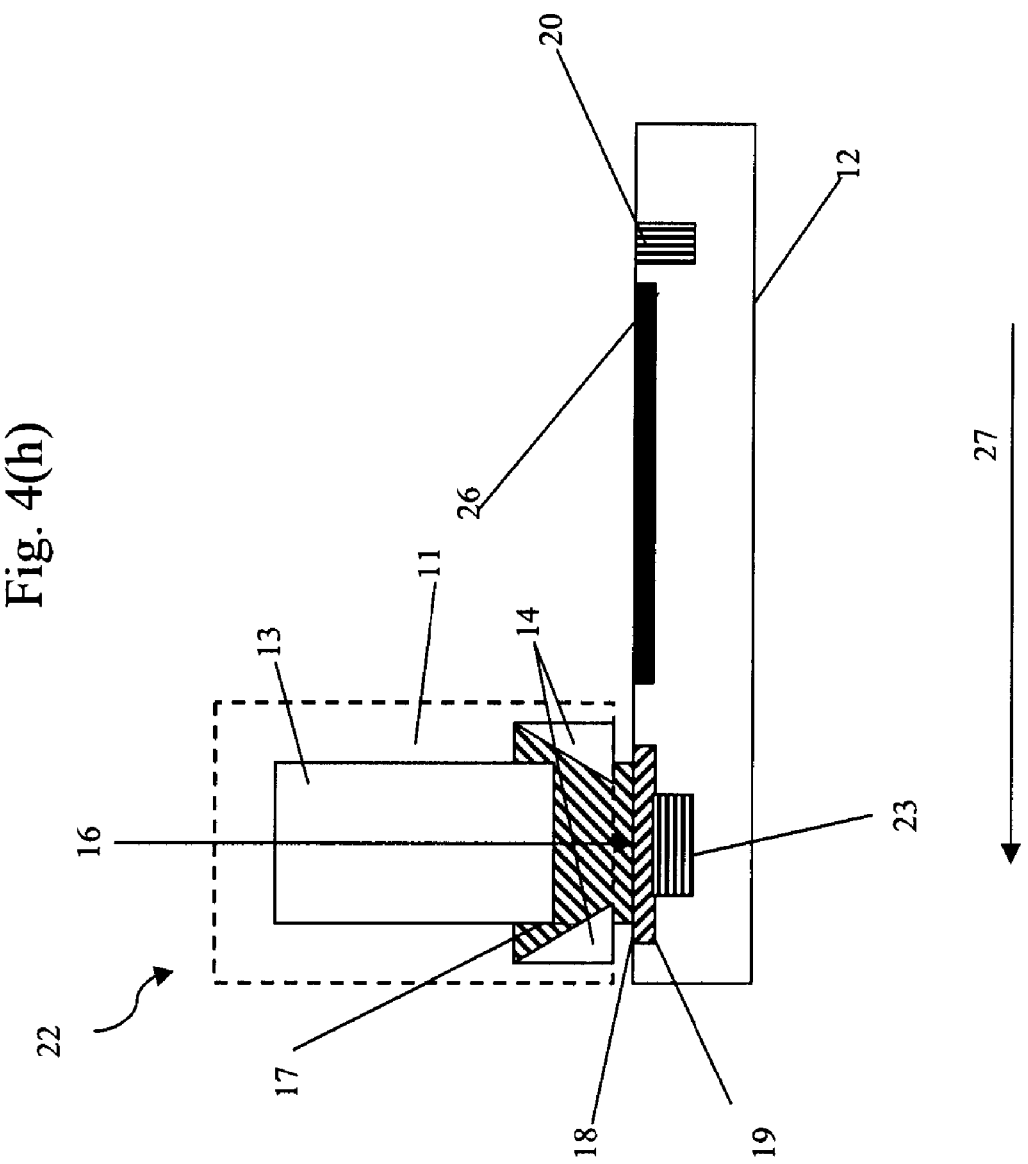

In FIG. 4(g), if the optical detector 23 detects that the center of the deep ultraviolet light 16 aligns with center of the plate holder 19, the set of shower heads 14 is lowered and the fluid closing plate 18 is placed into the plate holder 19. In FIG. 4(h), once the fluid closing plate 18 is in the plate holder 19, the fluid closing plate take-over process terminates and immersion fluid 17 is re-interposed between the projection lens 13 and the surface of the wafer 26. The scanner mechanism 11 continues to scan the wafer surface as the wafer holder 12 moves in the wafer loading direction 27.

FIG. 5 is a flow diagram of an exemplary process for fluid closing plate take-over for wafer unloading. The take-over process begins at step 30 when the wafer holder moves to a position where the scanner is directly over the plate holder after exposure. Next, a determination is then made at step 32 as to whether the center of the deep ultraviolet light passing through the circular pattern of the fluid closing plate is aligned with the center of the plate holder 19. The center of deep ultraviolet light 16 is aligned with the center of the plate holder 19 if the center of deep ultraviolet light 16 lies exactly in the center of the plate holder 19. If the center of the deep ultraviolet light does not align with the center of the plate holder 19, an error is triggered and the scanner is stopped at step 34. The take-over process terminates thereafter.

If the optical detector detects the center of the deep ultraviolet light aligns with the center of the plate holder 19, a set of shower heads is lowered to the closing plate surface at step 36. At step 38, the closing plate is affixed to the set of shower heads. The set of shower heads is then raised with the closing plate at step 40 and the wafer is unloaded at step 42.

Figure 6:
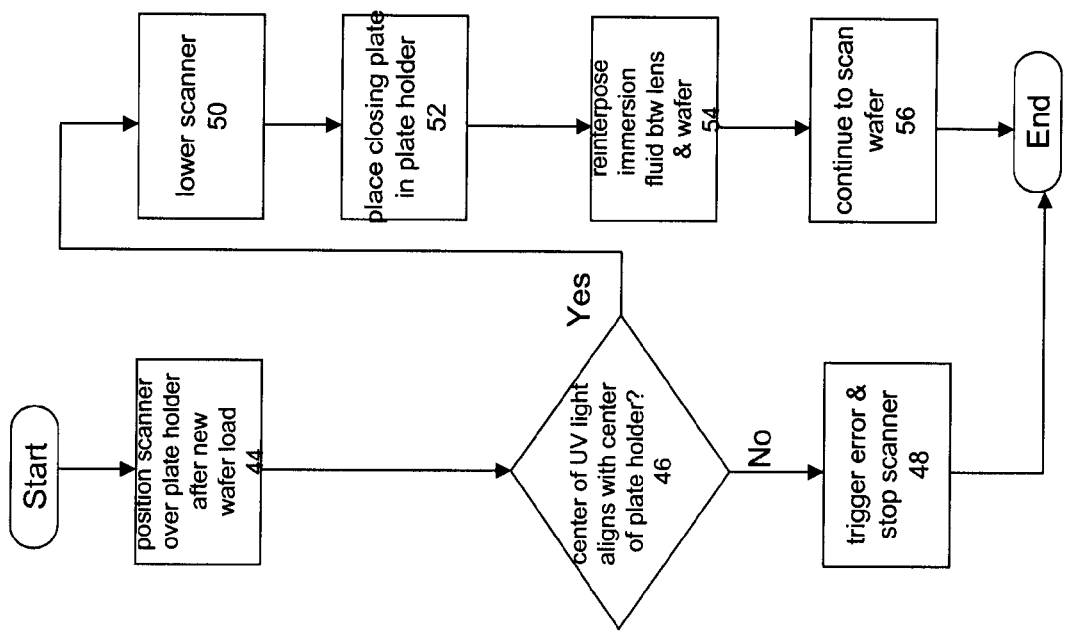
FIG. 6 is a flow diagram of an exemplary process for fluid closing plate take-over during wafer loading.

FIG. 6 is a flow diagram of an exemplary process for fluid closing plate take-over for wafer loading. The take-over process begins at step 44 when the wafer holder moves to a position where the scanner is directly over the plate holder after a new wafer is loaded. A determination is then made at step 46 as to whether the center of the deep ultraviolet light passing through the pattern is aligned with the center of the plate holder. If the center of the deep ultraviolet light does not align with the center of the plate holder, an error is triggered and the scanner is stopped at step 48. The take-over process terminates thereafter.

If the optical detector detects that the center of the deep ultraviolet light aligns with the center of the plate holder 19, the set of shower heads is lowered at step 50. At step 52, the closing plate is placed in the plate holder. The immersion fluid is re-interposed between the projection lens and the wafer surface at step 54. The scanner then continues to scan the wafer at step 56.

In summary, aspects of the present disclosure provide a method and system for fluid closing plate take-over in immersion lithography. By providing an optical detector under the plate holder of the wafer holder, the position of the closing plate may be monitored inline after every take-over. The position of the closing plate may be monitored based on the center of the deep ultraviolet light relative to the center of the plate holder. In addition, collision of the closing plate and the wafer holder or other materials may be avoided. Furthermore, efficiency may be improved as the need for calibration by the transmission image sensor (TIS) 20 is eliminated.

It is noted that the optical detector may also be implemented without the TIS. In that case, the optical detector may perform calibration function similar to TIS, but in a more accurate fashion with the ability of collecting plate position data after every take-over. In addition, the optical detector may be implemented such that the movement of the closing plate may be traced as the scanner is scanning the wafer. In this way, closing plate take-over may be safely performed each time without damaging the wafer or other materials.

Although embodiments of the present disclosure have been described in detail, those skilled in the art should understand that they may make various changes, substitutions and alterations herein without departing from the spirit and scope of the present disclosure. Accordingly, all such changes, substitutions and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. An immersion lithography system comprising:
a scanner for exposing a semiconductor wafer, wherein the scanner comprises:
a projection lens operable to project a light signal;
an immersion fluid interposing between the projection lens and surface of the wafer; and
a set of shower heads operable to constrain the immersion fluid underneath the projection lens; and
a wafer holder for holding the semiconductor wafer for exposure by the scanner, the wafer holder comprising a plate holder for holding a closing plate, and an optical detector, wherein the optical detector is located below the plate holder, whereby the scanner is operable to stop operations if the light signal is not aligned with the plate holder.

2. The system of claim 1, wherein the optical detector is located below a center of the plate holder with equal distance from both ends of the plate holder.

3. The system of claim 1, wherein the optical detector is operable to determine whether a light signal passing through the closing plate is aligned with the plate holder.

4. The system of claim 1, wherein the scanner is operable to place the closing plate into the plate holder if the light signal is aligned with the plate holder.

5. The system of claim 1, wherein the scanner is operable to affix the closing plate to a set of shower heads if the light signal is aligned with the plate holder.

6. A method of performing immersion lithography, the method comprising:
providing a scanner for exposing a semiconductor wafer;
projecting a light signal through a projection lens;
interposing an immersion fluid between the projection lens and a surface of the wafer;
constraining the immersion fluid underneath the projection lens using a set of shower heads;
holding the semiconductor wafer using a wafer holder for exposure by the scanner, wherein the wafer holder comprises a plate holder for holding a closing plate and an optical detector, wherein the optical detector is located below the plate holder; and stopping operations by the scanner if the light signal is not aligned with the plate holder.

7. The method of claim 6, further comprising determining whether a light signal passing through the closing plate is aligned with the plate holder using the optical detector.

8. The method of claim 6, further comprising placing the closing plate into the plate holder using the scanner if the light signal is aligned with the plate holder.

9. The method of claim 6, further comprising affixing the closing plate to a set of shower heads using the scanner if the light signal is aligned with the plate holder.

* * * * *